United States Patent
Summers et al.

(10) Patent No.: US 6,864,110 B2
(45) Date of Patent: Mar. 8, 2005

(54) ELECTROPHORETIC PROCESSES FOR THE SELECTIVE DEPOSITION OF MATERIALS ON A SEMICONDUCTING DEVICE

(75) Inventors: Christopher J. Summers, Dunwoody, GA (US); Hisham Menkara, Mableton, GA (US); Bee Yin Janet Chua, Penang (MY)

(73) Assignee: Agilent Technologies, Inc., Palo Alto, CA (US)

( * ) Notice: Subject to any disclaimer, the term of this patent is extended or adjusted under 35 U.S.C. 154(b) by 200 days.

(21) Appl. No.: 10/277,285

(22) Filed: Oct. 22, 2002

(65) Prior Publication Data

US 2004/0121502 A1 Jun. 24, 2004

(51) Int. Cl.⁷ ............................................. H01L 21/00
(52) U.S. Cl. ......................... 438/22; 438/466; 438/678
(58) Field of Search ............................ 438/22–28, 466, 438/469–470, 674–678

(56) References Cited

U.S. PATENT DOCUMENTS 4,092,445 A * 5/1978 Tsuzuki et al. ............. 438/510

* cited by examiner

Primary Examiner—H. Jey Tsai

(57) ABSTRACT

The present invention provides a process and apparatus for selectively depositing materials on a semiconductor device, such as depositing phosphors or other optical materials on a light emitting diode (LED), using an electrophoretic deposition process. The semiconductor device comprises a p-side and an n-side. A first biasing voltage is applied between an anode and the p-side of the semiconductor device. A second biasing voltage is applied between the p-side and the n-side of the semiconductor device. The relative biasing of the p-side and the n-side determines where coating is deposited on the semiconductor device. An optional pre-coating process is used to deposit a high resistivity dielectric material, such as silica, on the semiconductor device. The pre-coating can even the electric field on the surface of the semiconductor device, where local features such as metal connections or passivation layers disturb the electric field during phosphor deposition without pre-coating.

17 Claims, 3 Drawing Sheets

ELECTROPHORETIC PROCESSES FOR THE SELECTIVE DEPOSITION OF MATERIALS ON A SEMICONDUCTING DEVICE

TECHNICAL FIELD

The technical field of this disclosure is semiconductor manufacturing methods, particularly, a method for selectively depositing materials on a semiconductor device.

BACKGROUND OF THE INVENTION

Recent improvements in lighting technology have developed white solid-state lamp technology based on the use of a blue or ultraviolet AlGaN light-emitting diodes (LEDs) or laser diodes. These devices offer the exciting potential of highly efficient low voltage lighting sources that are rugged, highly reliable, and inexpensive. For highly industrial countries, the potential energy savings are very significant. In the U.S., about 20% of all electricity and about 7.2% of all energy is used for lighting. Energy savings also can result in environmental improvements by lowering the emissions from coal or oil fired power plants. Low voltage solid-state lighting also offers the opportunity to take advantage of local power sources, reducing the need for expensive power grids. Low voltage solid-state lighting offers a wide range of new lighting sources and products, including distributed panel lighting, conformable lighting systems, and intelligent lighting schemes.

A white solid-state lamp can be obtained by coating a conventional AlGaN diode with a phosphor. The phosphor is chosen so that it absorbs strongly in the regions of the diode emission (blue or UV) and efficiently transfers this energy to an activator that emits light in the visible spectrum, such as green or red, or a combination of green and red. One phosphor successfully used is yttrium aluminum garnet:cesium doped (YAG:Ce) phosphor. YAG:Ce phosphor has the advantage that the cesium activator strongly absorbs in the blue region and internally down converts this radiation into a broad yellowish spectrum, which combines with the blue pump light from the LED to produce a white spectrum. Other potential phosphor systems can use two activators or be excited in the blue or UV region. Additionally, several phosphors can be mixed to give a white light.

FIG. 1 shows a schematic diagram of a typical flat LED mounted in a reflective cup. The LED chip 80, having a top 81 and sides 82, comprises a p-side 84, an active region 85, and an n-side 86. A first leadframe 88 and second leadframe 90 can provide electrical connections between the LED chip 80 and a circuit board (not shown). The LED chip 80 is disposed in a reflective cup 92 in the first leadframe 88 to reflect light generated by the LED chip 80. The first leadframe 88 can be electrically connected to the n-side 86 directly by contact or wirebonded. The second leadframe 90 can be electrically connected to the p-side 84 by gold wire 94 at the top or side of the LED chip 80.

To achieve light emission, the LED chip 80 is typically forward biased by 2 to 4 Volts, equivalent to the band gap energy of the semiconductor, i.e., the p-side 84 is held at a positive 2 to 4 Volts over the n-side 86. In general, light emission occurs from the p-side 84 of the LED chip 80 and is emitted most intensely from the sides 82 of the LED chip 80, and less intensely from the top 81 of the p-side 84.

Rather than the flat LED chip illustrated in FIG. 1, the LED chip can have an inverted trapezoidal geometry, with the large face of the trapezoid on the top, so that the light generated within the p-side reflects internally and passes upwards from the LED chip. The inverted trapezoidal geometry has the disadvantage of requiring extra diode material to achieve the proper reflection angle. The trapezoidal, or any other externally shaped LED chip, can be used with or without a reflective cup.

The commercial technique typically employed in phosphor deposition on LEDs involves the use of phosphor powders blended in a liquid polymer system, such as polypropylene, polycarbonate or, more commonly, epoxy resin, or silicone. Generally, a small amount of the phosphor-impregnated epoxy is simply painted or dispensed on the LED die, then dried or cured. A clear epoxy lens is then constructed around the die, although the phosphor-impregnated epoxy can be used to construct the whole LED lens. Other techniques have also included dusting phosphor powders or spray painting phosphor powders liquid mixtures directly on the LED die.

Current phosphor deposition methods are inefficient in production and less than optimum in result. Rather than selectively coating only the light emitting regions of the diode, the phosphor is deposited over the whole diode package. Much of the phosphor is wasted, washing off during application and requiring retrieval later. The phosphor does not make good contact with the diode surface in the most desired locations for efficient energy transfer from the diode to the phosphor. In addition, the current phosphor deposition methods are difficult to translate into mass production for coating many single diodes and for coating large arrays of diodes mounted on circuit or ceramic boards.

The resulting white solid-state lamps may lack color repeatability and uniformity, so as to be unsuitable for color-critical applications. The lamps may be inefficient and convert less of the chip radiation into visible light than possible due to phosphor placement away from the light emitting regions of the diode, and absorption and reflection in binder materials.

It would be desirable to have a method for selectively depositing materials on a semiconductor device that would overcome the above disadvantages.

SUMMARY OF THE INVENTION

The present invention allows fine control over material deposition on a semiconductor device. This avoids deposition on the rest of the semiconductor device or mounting structure, reducing material waste and providing coating only where required. The present invention improves manufacturing efficiency by being able to operate as a continuous process and to coat arrays of semiconductor devices at one time.

One aspect of the present invention provides a method for coating a semiconductor device having a p-side and an n-side using a bath containing suspended particles. An anode is disposed in the bath with the semiconductor device. A first biasing voltage is applied between the anode and the p-side to hold the anode at a positive voltage with respect to the p-side. A second biasing voltage is applied between the p-side and the n-side to cause the suspended particles to deposit on the semiconductor device.

Another aspect of the present invention provides a system for coating a semiconductor device having a p-side and an n-side. The system comprises a bath containing suspended particles; an anode disposed in the bath; means for disposing the semiconductor device in the bath; means for applying a first biasing voltage between the anode and the p-side to hold the anode at a positive voltage with respect to the p-side; and means for applying a second biasing voltage between the p-side and the n-side.

Another aspect of the present invention provides a method for coating a light emitting diode having a p-side and an n-side using a bath containing phosphor particles and magnesium nitrate. An anode is disposed in the bath with the light emitting diode. A first biasing voltage is applied between the anode and the p-side to hold the anode at a positive voltage with respect to the p-side. A second biasing voltage is applied between the p-side and the n-side to cause the phosphor particles to deposit on the light emitting diode.

The foregoing and other features and advantages of the invention will become further apparent from the following detailed description of the presently preferred embodiments, read in conjunction with the accompanying drawings. The detailed description and drawings are merely illustrative of the invention, rather than limiting the scope of the invention being defined by the appended claims and equivalents thereof.

DETAILED DESCRIPTION OF THE PRESENTLY PREFERRED EMBODIMENT

The present invention provides a process and apparatus for selectively depositing materials on a semiconductor device, such as depositing phosphors or other optical materials on a light emitting diode (LED), using an electrophoretic deposition process. The semiconductor device comprises a p-side and an n-side. A first biasing voltage is applied between an anode and the p-side of the semiconductor device. A second biasing voltage is applied between the p-side and the n-side of the semiconductor device. The relative biasing of the p-side and the n-side determines where coating is deposited on the semiconductor device. An optional pre-coating process is used to deposit a high resistivity dielectric material, such as silica, on the semiconductor device. The pre-coating can even the electric field on the surface of the semiconductor device, where local features such as metal connections or passivation layers disturb the electric field during phosphor deposition without pre-coating.

Figure 2A:
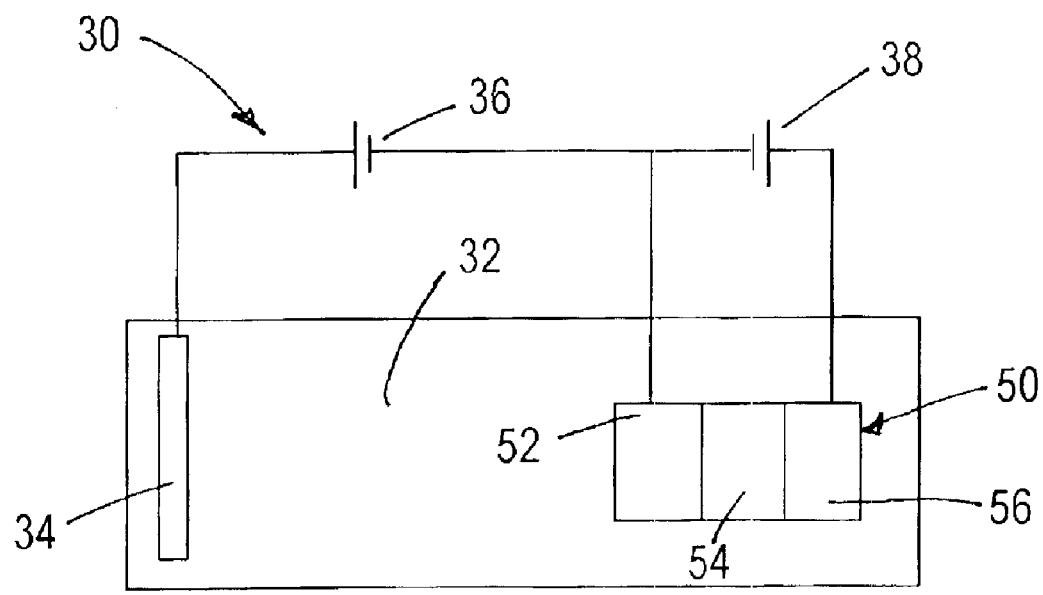
FIGS. 2A & 2B show an apparatus and potential plot, respectively, for a method for selectively depositing materials on a semiconductor device of the present invention.
Figure 2B:
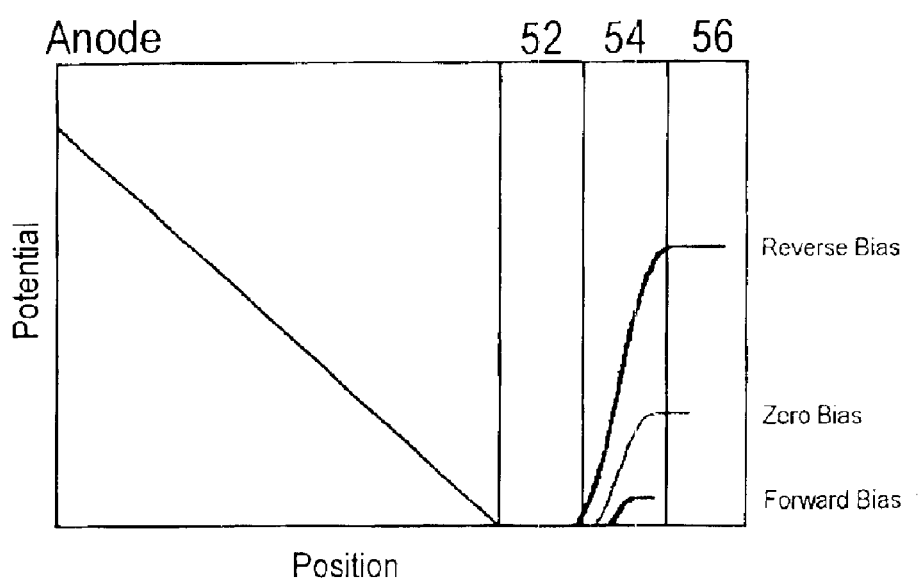

FIGS. 2A & 2B show an apparatus block diagram and a potential plot, respectively, for the method for selectively depositing materials on a semiconductor device of the present invention. The exemplary case of phosphor particle deposition on a light emitting diode (LED) is presented.

The electrophoretic (EP) deposition apparatus 30 comprises a bath 32, an anode 34, a first power supply 36, and a second power supply 38. The EP deposition apparatus 30 is connected to a semiconductor device 50 to be coated. The electrical connections to the semiconductor device 50 depend on the configuration of the semiconductor device 50. For an LED lamp connected to a leadframe, the electrical connection is through the leadframe. A number of leadframes are connected in parallel to make a batch for coating. For an LED wafer or circuit board containing a plurality of LED chips, the electrical connection is through an interface providing connection to each of the LED junctions. The electrical connection is made by any arrangement performing the function of providing voltage across the semiconductor device.

The bath 32 comprises a fluid solvent, such as isopropyl alcohol, with a solid electrolyte, such as magnesium nitrate ($Mg(NO_3)_2$), sodium nitrate ($NaNO_3$), or any other chemical compound (salt, acid, or base) that dissociates into electrically charged ions when dissolved in the fluid solvent. The resulting electrolyte dissolved in the solvent is used to make the solvent conductive. The bath 32 also contains suspended particles such as phosphor particles. The bath 32 is typically held in a basin for batch processing of semiconductor devices, although in other embodiments the bath 32 flows through a channel for continuous processing. A small amount of water is generally added to the bath 32 to enhance the reaction rate and adhesion properties. For the exemplary case of a magnesium nitrate electrolyte, magnesium hydroxide is produced at the cathode by the hydrolysis of water, which reacts with the magnesium ions. The magnesium hydroxide acts as a binder for the phosphor deposited on the cathode, increasing the adherence of the phosphor to the substrate surface. The electrolyte also positively charges the particles to be deposited, such as phosphor particles, so that the particles are driven by an electric field onto a cathode where they adhere.

The EP deposition apparatus 30 generally includes a stirring device (not shown) to keep the bath 32 mixed. The solution is well mixed by stirring, such as stirring for 24 hours. The anode 34 is a large plate of platinum, carbon, or other inert conducting material. The semiconductor device 50 is mechanically disposed in the bath 32 with a frame (not shown) supporting the semiconductor device 50 or a plurality of semiconductor devices. Typically, the frame is arranged to avoid interfering with the flow of the bath 32 and particle deposition. The frame is any arrangement performing the function of disposing the semiconductor device in the bath.

The semiconductor device 50 has a p-i-n junction and comprises a p-side 52, an active region 54, and an n-side 56. The semiconductor device 50 is any semiconductor device having a semiconductor junction, such as a light emitting diode (LED), electroluminescent device, laser diode, pnp or npn transistor, Charge-Coupled Devices CCD, CMOS imager, amorphous silicon device, X-ray imager, phototransistor or any other semiconductor or semiconductor device arrays. The first power supply 36 is connected between the anode 34 and the p-side 52 of the semiconductor device 50 to supply a first biasing voltage; the second power supply 38 is connected between the p-side 52 and the n-side 56 of the semiconductor device 50 to supply a second biasing voltage. The first power supply 36 maintains the anode 34 at a positive voltage with respect to the p-side 52 to drive the phosphor particles toward the semiconductor device 50. The p-side 52 acts as the bath cathode. The semiconductor device 50 is a single device, such as a single LED, or arrays of semiconductor devices, such as a plurality of LEDs mounted on a PC board.

Those skilled in the art will appreciate that the particular electrode separation between the anode 34 and the p-side 52, voltages, and semiconductor device configuration is varied depending on the conditions, sample size, conductivity, and the results desired. For example, an electrode separation between the anode 34 and the p-side 52 of about 3 to 10 cm and first power supply 36 voltage of about 40 to 500 Volts is used. The current varies from about 5 to 100 mA/cm$^2$ depending on the area size to be coated and the deposition time desired. Feature sizes as small as 40 $\mu$m with coatings of 2 to 10 mg/cm² have been achieved with the present EP deposition process.

Applying a potential across the semiconductor device 50 locally affects the phosphor particles' deposition. The local field strength is much greater than the field strength between the anode 34 and the p-side 52, because the thickness of the active region 54 in the semiconductor device 50 is typically very small. In one embodiment, the second power supply 38 supplies a positive voltage to the n-side 56 with respect to the p-side 52 so that the semiconductor device 50 is reverse biased. In another embodiment, the second power supply 38 is switchable so that the second power supply 38 supplies a positive voltage to the n-side 56 with respect to the p-side 52 (semiconductor device 50 reverse biased), supplies neutral voltage to the n-side 56 with respect to the p-side 52 (semiconductor device 50 zero biased), or supplies a negative voltage to the n-side 56 with respect to the p-side 52 (semiconductor device 50 forward biased).

Although FIG. 2A provides the example of applying voltages with the first power supply 36 connected between the anode 34 and the p-side 52, and the second power supply 38 connected between the p-side 52 and the n-side 56, different configurations can be used to produce the relative voltages required. In another embodiment, the second power supply can be connected between the anode 34 and the n-side 56 to provide the second biasing voltage across the semiconductor device 50, with the first power supply 36 remaining connected between the anode 34 and the p-side 52. In yet another embodiment, the p-side 52 and the n-side 56 can be shorted together to zero bias the semiconductor device 50.

FIG. 2B shows a potential plot relative to the position of the elements shown in FIG. 2A for different biasing of the semiconductor device. The potential between the anode 34 and the p-side 52 (bath cathode) is supplied by the first power supply 36. In experiments, spacings between the anode 34 and the p-side 52 of 3 to 6 cm were used with potentials of 20 to 200 Volts, creating field strengths of 3.33 to 66.67 Volts/cm. The potential between the p-side 52 and the n-side 56 is supplied by the second power supply 38. The voltage drop across the semiconductor device 50 is small in magnitude compared to the potential between the anode 34 and the p-side 52, but the spacing between the p-side 52 and the n-side 56 is small, so the resulting field strength is large. A voltage drop across the semiconductor device 50 of approximately 0.2 to 0.4 Volts with a spacing of 1 to 2 μm yields a field strength of about 2,000 Volts/cm. Although the actual effect may be smaller due to local interaction between the solution and the sides of the semiconductor device, the field strength is substantial and the various bias modes are used to achieve different results. Three biasing modes are defined depending how the second power supply 38 voltage is applied: forward biasing when the p-side voltage is greater than the n-side voltage, zero biasing when the p-side voltage is the same as the n-side voltage, and reverse biasing when the p-side voltage is less than the n-side voltage.

At zero bias between the p-side and n-side, the electric field across the semiconductor device 50 will be zero at the p-side 52, become increasingly negative (for example, by about 2 Volts in an InGaN diode), before increasing to become zero again at the start of the n-side 56. The potential across the semiconductor device 50 will therefore become increasingly more positive between the p-side 52 and n-side 56. Under this condition if the p-side 52 and n-side 56 are connected, the lowest field point will be at the center of the active region 54, and phosphor particles will deposit there first.

For zero biasing near equilibrium conditions, the high junction field in the semiconductor device 50 will spread into the bath 32 and quickly results in the phosphor particles being deposited along the sides of the semiconductor device 50. However, the high driving rate can quickly deplete phosphor particles from the bath 32 close to the high field strength region. The size of the depleted region will depend on the diffusion rate of the phosphor particles in the bath 32. Unless more phosphor particles can diffuse into the bath 32 around this high field strength region, the EP deposition process will slow down to match the rate at which phosphor particles can diffuse into this region, limiting the layer thickness and deposition rate.

For forward bias across the semiconductor device 50, the voltage drop across the depletion region of the semiconductor device 50 becomes very small as the applied voltage becomes equal to the built-in bias of the semiconductor device 50. Thus, the junction field strength and field distribution in the bath 32 near the semiconductor device 50 is greatly reduced and approaches zero. The potential of the n-side 56 is close to that of the p-side 52, so the highest voltage drop in the bath 32 occurs between the bath anode 34 and all surfaces of the semiconductor device 50. For the exemplary device, the phosphor deposition will not be discriminatory and will cover the entire LED, including the reflective cup if it is connected to the n-side. The forward biasing voltage is kept below the rated voltage for the semiconductor device to avoid damage to the semiconductor device.

Another embodiment using forward biasing involves the use of the light emission from the LED inside the bath 32 to photoelectrically enhance deposition of the phosphor particles in the light emitting areas of the semiconductor device 50. This is a result of the "photoelectric effect," which enhances the conductivity of some materials through ionization. Therefore, the conductivity of ionized particles in the vicinity of the LED light emitting areas is enhanced, resulting in thicker deposition layers where the light flux is higher. This leads to a more uniform down-conversion of the LED light and subsequently a more isotropic optical emission from the device.

For reverse bias across the semiconductor device 50, the n-side 56 of the semiconductor device 50 will have a high positive voltage with respect to the p-side 52 of the semiconductor device 50 and also a small negative voltage with respect to the bath anode 34. Thus, the potential profile driving the phosphor particles deposition will be steepest between the bath anode 34 and the p-side 52 of the semiconductor device 50. Most phosphor particles will be deposited at p-side 52. For the exemplary process of phosphor deposition on an LED, the phosphor particles are preferably deposited on the top of the p-side 52 and on the sides of the LED very close to the active region 54, as required for best performance in most applications. The reverse biasing voltage is kept below the reverse bias breakdown voltage for the semiconductor device to avoid damage to the semiconductor device. The reverse bias breakdown voltage is large for most semiconductor devices, such as InGaN diodes, so the reverse bias breakdown voltage does not present a practical limitation.

Sequential application of the different biasing modes is used to tailor the phosphor particles' deposition on the semiconductor device to the desired thickness and location. Forward biasing the semiconductor device is used to coat the side of the semiconductor device. Reverse biasing the semiconductor device is used to coat the top of the semiconductor device. Thus, by alternating forward and reverse biasing, a coating profile is deposited which optimizes the coating thickness between the top and sides of the semiconductor device. For the exemplary device, the phosphor coating is distributed between the top and sides of the LED to optimize the production of light from the LED without wasting phosphor coating in locations where little or no light is produced.

Figure 1:
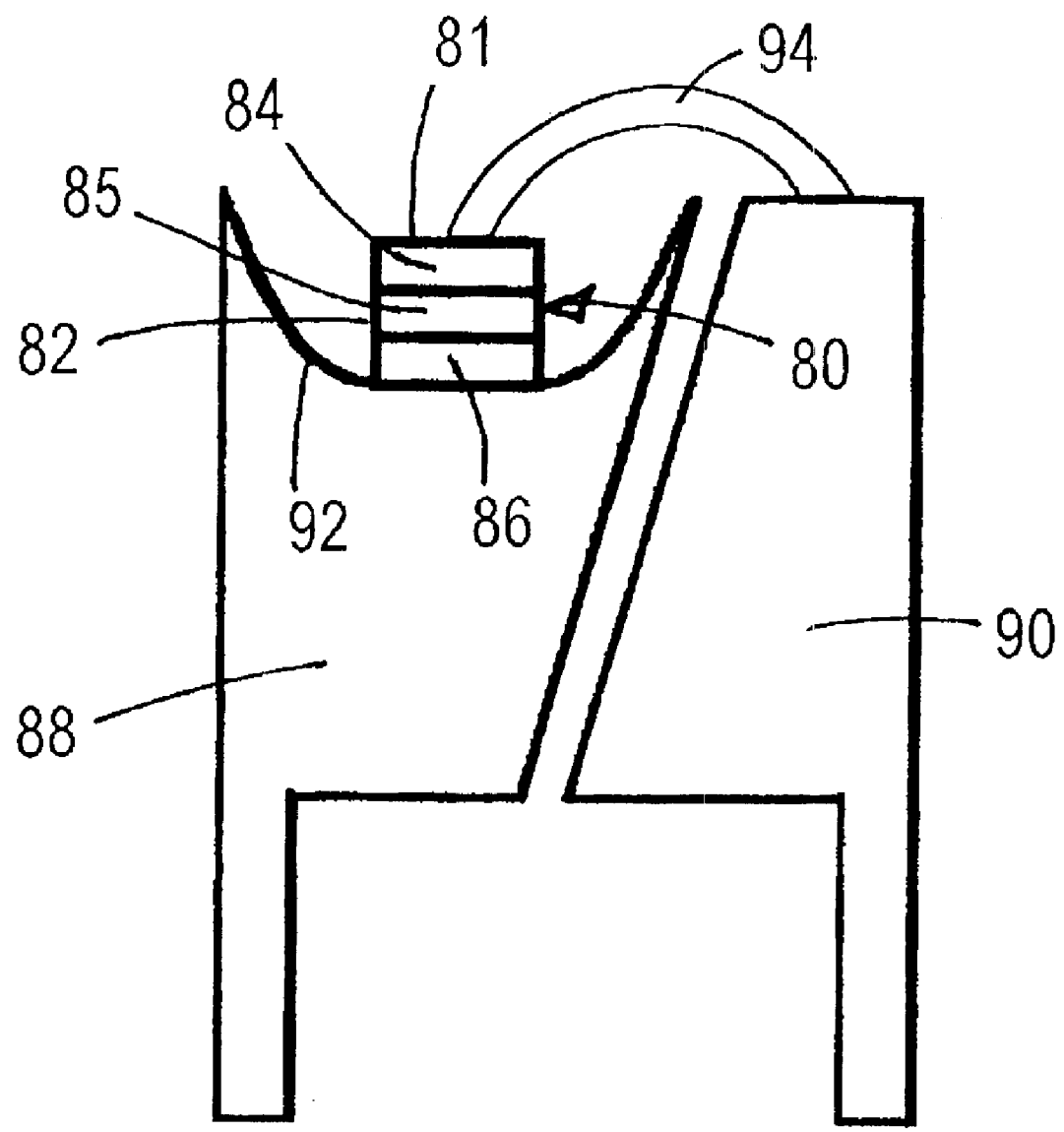
FIG. 1 shows a schematic diagram of a typical flat LED mounted in a reflective cup.

The EP deposition process is used even if the LED chip 80 of FIG. 1 is inverted, so that the n-side becomes the top 81 and the p-side is attached to the reflective cup 92. Applying a reverse bias during the EP deposition process, phosphor coating will be driven to the p-side, coating the sides of the LED chip near the p-side where most light is emitted. Subsequently applying a reduced reverse bias or a forward bias can produce more deposition on the n-side at the top of the LED chip. Pre-coating can also be used with the inverted LED chip in order to produce a more even potential drop across the various device surfaces as described below.

In one embodiment, the coating is applied to the semiconductor device while reverse biasing the semiconductor device. In another embodiment, the coating is applied to the semiconductor device while alternately forward biasing and reverse biasing the semiconductor device. In another embodiment, the coating is applied to the semiconductor device after first applying a pre-coating to the semiconductor device.

Although the exemplary case of phosphor particle deposition has been discussed herein, the particles suspended in bath 32 for deposition on a semiconductor device in accordance with the present invention are not limited to phosphor particles. Optical materials, high resistivity dielectric materials, silica, titanium dioxide, or any particle that can be deposited by EP deposition, and combinations thereof, can be used. The different materials are typically used singly in the bath, but in some embodiments, two or more different materials are mixed simultaneously within the bath.

An optional pre-coating is used to account for local features of the semiconductor device that disturb the electrical potential across the surface of the semiconductor device during the EP deposition process and result in uneven coating. For example, gold electrical contacts are often used to make the electrical connection to the highly doped semiconductor in the semiconductor device. In another example, dielectric layers are often applied to various surfaces of the semiconductor device for passivation. The differences in dielectric constants of the various materials disturb the electrical lines of force around the semiconductor device: lines of force bunch up near high conductivity regions on the surface, such as metals, and spread out near low conductivity regions, such as dielectrics. The suspended particles' deposition follows the lines of force, resulting in an uneven coating.

The pre-coating is a high resistivity dielectric material, such as silica ($SiO_2$) or titanium dioxide ($TiO_2$), or other oxide system applied by the EP deposition process, where the high resistivity dielectric material is deposited from suspended particles in the bath. In one embodiment, the pre-coating suspended particles are contained in a different bath from the bath used to deposit phosphors. In another embodiment, the pre-coating suspended particles are mixed in the same bath with the phosphors. The pre-coating is either transparent ($SiO_2$) or diffuse ($TiO_2$) to visible light depending on the desired optical effect. The pre-coating suspended particles are initially deposited in high conductivity regions, where the field lines are closely bunched. The pre-coating makes the high conductivity regions less conductive as the pre-coating suspended particles are deposited, evening out the field lines, so that fewer pre-coating suspended particles are deposited in the formerly high conductivity regions as the pre-coating process continues. The pre-coating process results in an equal potential surface across the semiconductor device, so that the coating is evenly applied.

The pre-coating process can also use the different biasing modes to tailor the pre-coating on the semiconductor device to the desired thickness and location. For the exemplary semiconductor device, silica pre-coating is deposited on the LED, initially at zero bias, then at forward bias. The n-side and junction regions of the LED will be coated with a resistive layer. When the phosphor coating is subsequently deposited in the reverse bias mode, the driving field for deposition will be less in the n-side and junction regions of the LED, increasing the deposition on the p-side of the LED where phosphor deposition is most desired.

In another embodiment, a hydrophobic mask, such as plastic or photoresist is applied to the semiconductor device to protect selected areas on the semiconductor device and associated package from exposure to the bath. The mask will also serve to insulate certain metallic or conductive areas (such as leadframes, circuit interconnects, etc.) used for packaging the semiconductor device. This will prevent the phosphor or dielectric materials from unnecessarily coating conductive but non-light emitting areas. The hydrophobic mask is applied by conventional means, such as spraying through a mask, silk screening, or vapor deposition. The hydrophobic mask is applied with spraying apparatus, printing apparatus, chemical apparatus, or any apparatus performing the function of masking the semiconductor device.

The application of the mask could be only temporary, prior to insertion of the device package into the electrolyte bath, or, depending on the material, could become a permanent layer protecting the device package from subsequent handling. Suitable materials such as photoresist are used for temporary masks to allow easy removal with a solvent solution. The application of a mask also helps reduce the amount of materials used for each EP deposition run. The effective conducting surface area exposed to the bath is reduced, preserving the phosphor, dielectric, and electrolyte in the bath for subsequent deposition runs.

Those skilled in the art will appreciate that a variety of treatments are used after the semiconductor device is removed from the bath to complete manufacture. The semiconductor device is removed from the bath, washed in isopropyl alcohol, washed in deionized water, and dried, such as drying in an oven for about 20 minutes at about 100 to 200 degrees Celsius. Optionally, the semiconductor device is heat treated to harden the coating. A liquid polymer system, such as polypropylene, polycarbonate, epoxy resin, or silicone, is used to construct a lens over the semiconductor device, as required.

Figure 3:
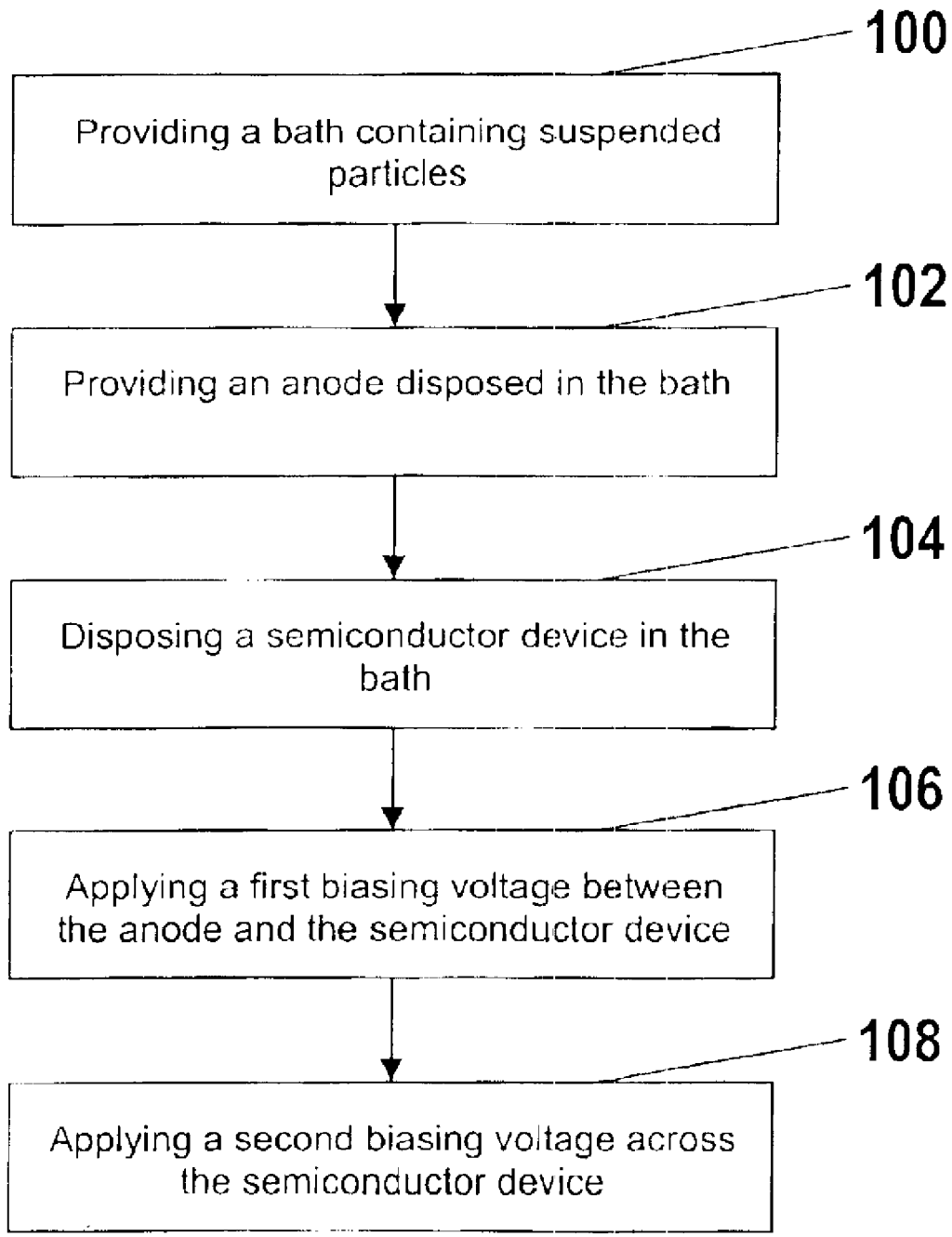
FIG. 3 shows a flow chart of a method for selectively depositing materials on a semiconductor device of the present invention.

FIG. 3 shows a flow chart of a method for selectively depositing materials on a semiconductor device of the present invention. At 100, a bath containing suspended particles is provided. Typically, the bath comprises a solvent with a solid electrolyte dissolved in the solvent and the suspended particles are one or more types of phosphor particles or a high resistivity dielectric material. An anode and semiconductor device are disposed in the bath 102, 104. Typically, the semiconductor device is an LED or other semiconductor device having a light emitting area and having an n-side and a p-side. At 106, a first biasing voltage is applied between the anode and the n-side of the semiconductor device, with the anode held positive with respect to the n-side. A second biasing voltage is applied between the p-side and the n-side of the semiconductor device 108. The second biasing voltage is typically switchable between reverse bias, zero bias, and forward bias, so the suspended particles are deposited on the desired area of the semiconductor device. Optionally, a mask can be applied to the semiconductor device to further limit the deposition regions on the semiconductor device. Additional layers, deposits of different materials, deposits on different regions of the semiconductor device, or combinations thereof are possible by repeating the method.

It is important to note that the figures and description herein illustrate specific applications and embodiments of the present invention, and are not intended to limit the scope of the present disclosure or claims to that which is presented therein. For example, different semiconductor devices, electrophoretic deposition methods, and suspended particles can be used. Upon reading the specification and reviewing the drawings hereof, it will become immediately obvious to those skilled in the art that myriad other embodiments of the present invention are possible, and that such embodiments are contemplated and fall within the scope of the presently claimed invention.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

What is claimed is:

1. A method for coating a semiconductor device, the semiconductor device having a p-side and an n-side, the method comprising:

providing a bath, the bath containing suspended particles;

providing an anode, the anode disposed in the bath;

disposing the semiconductor device in the bath;

applying a first biasing voltage between the anode and the p-side, the anode held at a positive voltage with respect to the p-side; and applying a second biasing voltage between the p-side and the n-side.

2. The method of claim 1 wherein the second biasing voltage is selected from the group consisting of reverse bias, zero bias, and forward bias.

3. The method of claim 1 wherein applying a second biasing voltage between the p-side and the n-side further comprises applying a second biasing voltage switchable between a reverse bias, a zero bias, and a forward bias.

4. The method of claim 1 wherein applying a second biasing voltage between the p-side and the n-side comprises applying a voltage between the anode and the n-side.

5. The method of claim 1 wherein the semiconductor device is selected from the group consisting of a light emitting diode (LED), an electroluminescent device, a laser device, a pnp transistor, an npn transistor, a Charge-Coupled Device CCD, a CMOS imager, an amorphous silicon device, an X-ray imager, a phototransistor, a semiconductor, and a semiconductor device array.

6. The method of claim 1 wherein the semiconductor device is one of a plurality of semiconductor devices disposed in the bath.

7. The method of claim 1 further comprising pre-coating the semiconductor device.

8. The method of claim 7 wherein pre-coating the semiconductor device comprises pre-coating the semiconductor device with a high resistivity dielectric material coating.

9. The method of claim 1 further comprising masking the semiconductor device.

10. The method of claim 1 wherein the suspended particles are phosphor particles.

11. The method of claim 1 wherein the suspended particles are selected from the group consisting of optical materials, high resistivity dielectric materials, phosphor, silica, titanium dioxide, and combinations thereof.

12. The method of claim 1 wherein applying a second biasing voltage between the p-side and the n-side further comprises applying a second biasing voltage between the p-side and the n-side to cause the semiconductor device to emit light, the light ionizing the bath.

13. A method for coating a light emitting diode, the light emitting diode having a p-side and an n-side, the method comprising:

providing a bath, the bath containing phosphor particles and magnesium nitrate;

providing an anode, the anode disposed in the bath;

disposing the light emitting diode in the bath;

applying a first biasing voltage between the anode and the p-side, the anode held at a positive voltage with respect to the p-side; and applying a second biasing voltage between the p-side and the n-side.

14. The method of claim 13 wherein applying a second biasing voltage between the p-side and the n-side further comprises switching the second biasing voltage between a reverse bias, a zero bias, and a forward bias.

15. The method of claim 13 wherein applying a second biasing voltage between the p-side and the n-side comprises applying a voltage between the anode and the n-side.

16. The method of claim 13 further comprising pre-coating the light emitting diode with silica.

17. The method of claim 13 further comprising masking the semiconductor device.

* * * * *